(12) United States Patent
Zhang et al.

(10) Patent No.: US 7,800,369 B2
(45) Date of Patent: Sep. 21, 2010

(54) HYBRID AUTOMATIC TUNING/MATCHING FOR NMR PROBES

(75) Inventors: Xiao Zhang, Cupertino, CA (US); John S. Tobias, Campbell, CA (US)

(73) Assignee: Varian, Inc., Santa Clara, CA (US)

( * ) Notice: Subject to any disclaimer, the term of this patent is extended or adjusted under 35 U.S.C. 154(b) by 0 days.

(21) Appl. No.: 12/130,214

(22) Filed: May 30, 2008

(65) Prior Publication Data

US 2009/0295388 A1    Dec. 3, 2009

(51) Int. Cl.
*G01V 3/00*    (2006.01)
(52) U.S. Cl. ..................................... 324/318
(58) Field of Classification Search .......... 324/300–322
See application file for complete search history.

(56) References Cited

U.S. PATENT DOCUMENTS

| 4,902,975 | A  | 2/1990  | Kess          |
|-----------|----|---------|---------------|
| 6,204,665 | B1 | 3/2001  | Triebe et al. |
| 6,323,647 | B1 | 11/2001 | Anderson et al. |
| 7,352,185 | B1 | 4/2008  | Zens et al.   |

FOREIGN PATENT DOCUMENTS

WO    2005/103749 A1    11/2005

*Primary Examiner*—Brij B Shrivastav
*Assistant Examiner*—Dixomara Vargas
(74) *Attorney, Agent, or Firm*—Edward H. Berkowitz; Bella Fishman

(57) ABSTRACT

Remote adjustment of a selected one of a plurality of adjustable NMR probe circuit components is achieved with a plurality of selectable linear actuators, the selected one of which urges a platen against a respective driven gear, azimuthally locked to its shaft, to displace it axially along that shaft. When the driven gear engages a driving gear a single driving motor is energized and controlled to effect the desired adjustment.

11 Claims, 10 Drawing Sheets

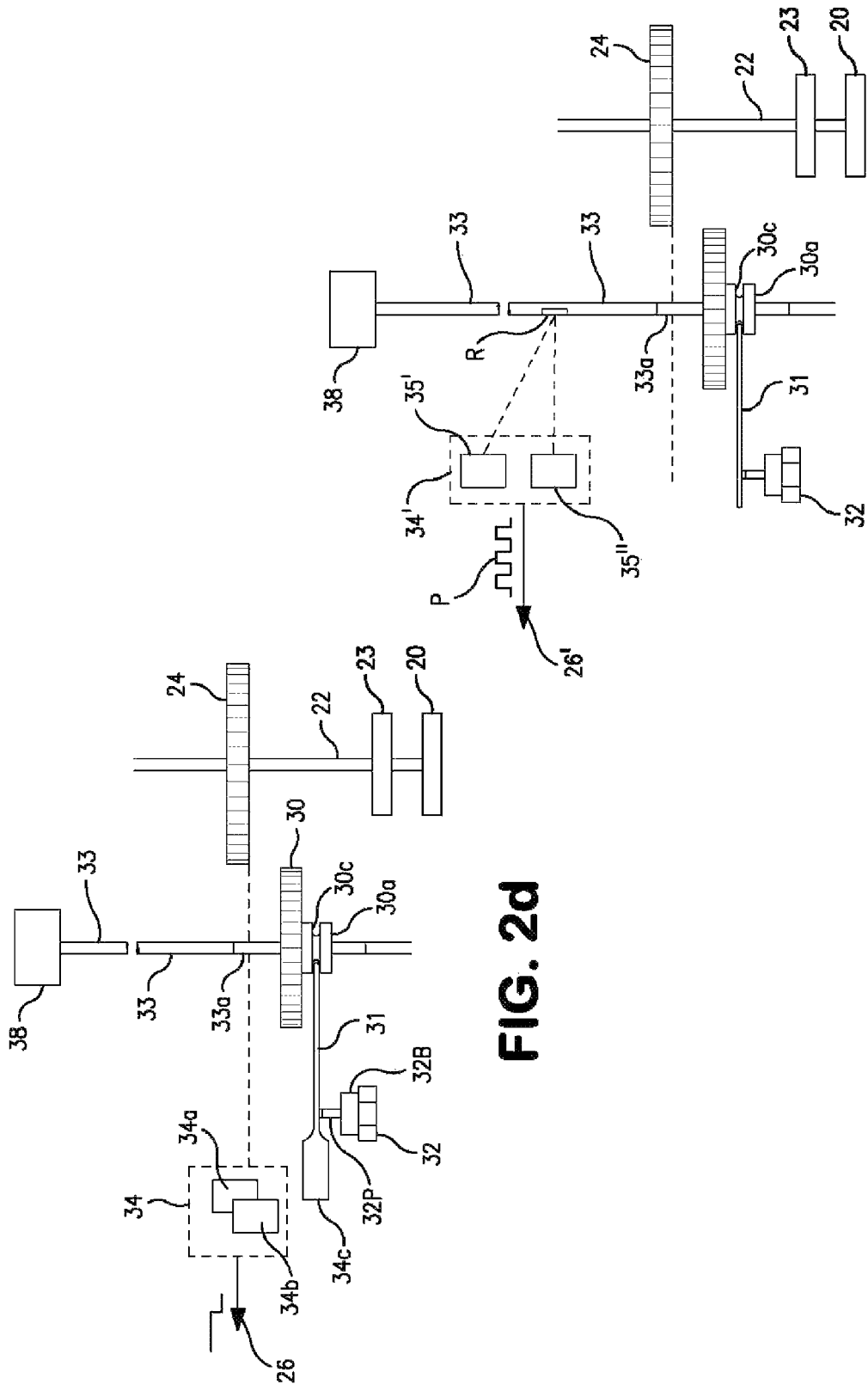

HYBRID AUTOMATIC TUNING/MATCHING FOR NMR PROBES

FIELD OF THE INVENTION

This work is in the field of NMR probe structure and particularly relates to mechanisms for effecting remote/automatic tuning and matching of probe circuits.

BACKGROUND OF THE INVENTION

It is necessary to adjust components of the resonant circuit(s) of an NMR probe to tune the circuit and to match the circuit to the transmission line directed to the respective RF source/sink. In earlier years, this operation might be done in the purest sense of manual intervention, e.g., manually turning a shaft at the base of the probe body to vary a capacitance or displace a tuning paddle. This operation could be an awkward exercise because of the physical distance of the NMR probe (in a magnet bore) remote from the console of the instrument, and more particularly because introduction of each sample for study typically requires a repetition of the procedure. A tune and match operation that is driven by a mechanism is necessary to enable a feedback arrangement, which can be consistent and efficient, as well as the possibility for unattended operation when a large number of samples are to be examined seriatum. Moreover, simple direct mechanical coupling to a circuit component is not desirable for cryogenic NMR probes housed in a vacuum environment and for which thermal isolation of the resonant circuit is a major design goal.

Prior art directed to this problem has employed stepping motors to turn shafts mechanically coupled to capacitors located in the resonant circuit. Modern NMR probes feature a plurality of RF channels and a similar plurality of adjustments. A prior art approach to this matter utilizes a plurality of motors in one to one association with each adjustable component. An example is U.S. Pat. No. 6,204,665, licensed to Varian, Inc.

Another prior approach to remote/automated multiple NMR probe adjustments employed a first motor for rotating a driving gear and a second motor to axially displace the first motor and its driving gear to an axial position wherein a selected driven gear is engaged. A shaft associated with the selected driven gear is coupled to the respective variable component (capacitor) to achieve the desired circuit adjustment. This arrangement is described in U.S. Pat. No. 6,323,647, assigned to Varian, Inc.

SUMMARY OF THE INVENTION

The present work employs linear actuators preferably of the pneumatic type to engage a selected driven gear with a driving gear to thereby obtain electrically manipulated adjustment requiring only a single motor. From a plurality of possible driven gears attached to corresponding shafts, a selected gear engagement is obtained by energizing a selected linear actuator to displace a platen supporting the selected driven gear to engage the central driving gear. The driven gear has an axial degree of freedom on its corresponding driven shaft while azimuthally locked to that driven shaft. This is accomplished by introducing a non-circular cross section to the driven shaft and a conforming aperture in the driven gear. The driven shaft, corresponding to the selected actuator, effects the adjustment of the corresponding circuit component whether through a rotation or a linear displacement (obtained with a captive nut/lead screw in axial translation along a threaded shaft). An optical sensor detects engagement of the driven gear with the driving gear and provides a logic signal for enablement of power to the motor. A coded interlock arrangement assures that only a single actuator is excited as is desired for the present context wherein each circuit adjustment is performed independently of all others. The desired lockout of all but the selected adjustment is realized at the level of instruction decoding in a digital processor and/or by a logic driven gate controlling pneumatic pressure (or the equivalent) for excitation of the actuator (or a combination of both). It is remarked that in other contexts, such multiple concurrent adjustments may be a specific goal and the enablement of such combinations through a mechanism as shown in FIG. 1 secures synchronization of such adjustments; however, that mode of operation is not a goal of the present work.

A shaft encoder on the driving shaft establishes the number of revolutions and fraction thereof of the driving gear. The azimuthal position for the driven shaft is then easily determined relative to an initial angle for recordation by the processor to facilitate return to that condition, at least approximately, for the selected driven shaft.

BRIEF DESCRIPTION OF THE DRAWINGS

FIG. 2d shows platen structure and optical signal arrangement.

FIG. 7 shows an alternative arrangement for obtaining a fault detection signal.

In the interest of maintaining clarity in graphic representation of complex structures, substantially identical mechanical components are not everywhere labeled where their similarity to labeled structures is evident.

DETAILED DESCRIPTION OF THE PREFERRED EMBODIMENT

Figure 1:
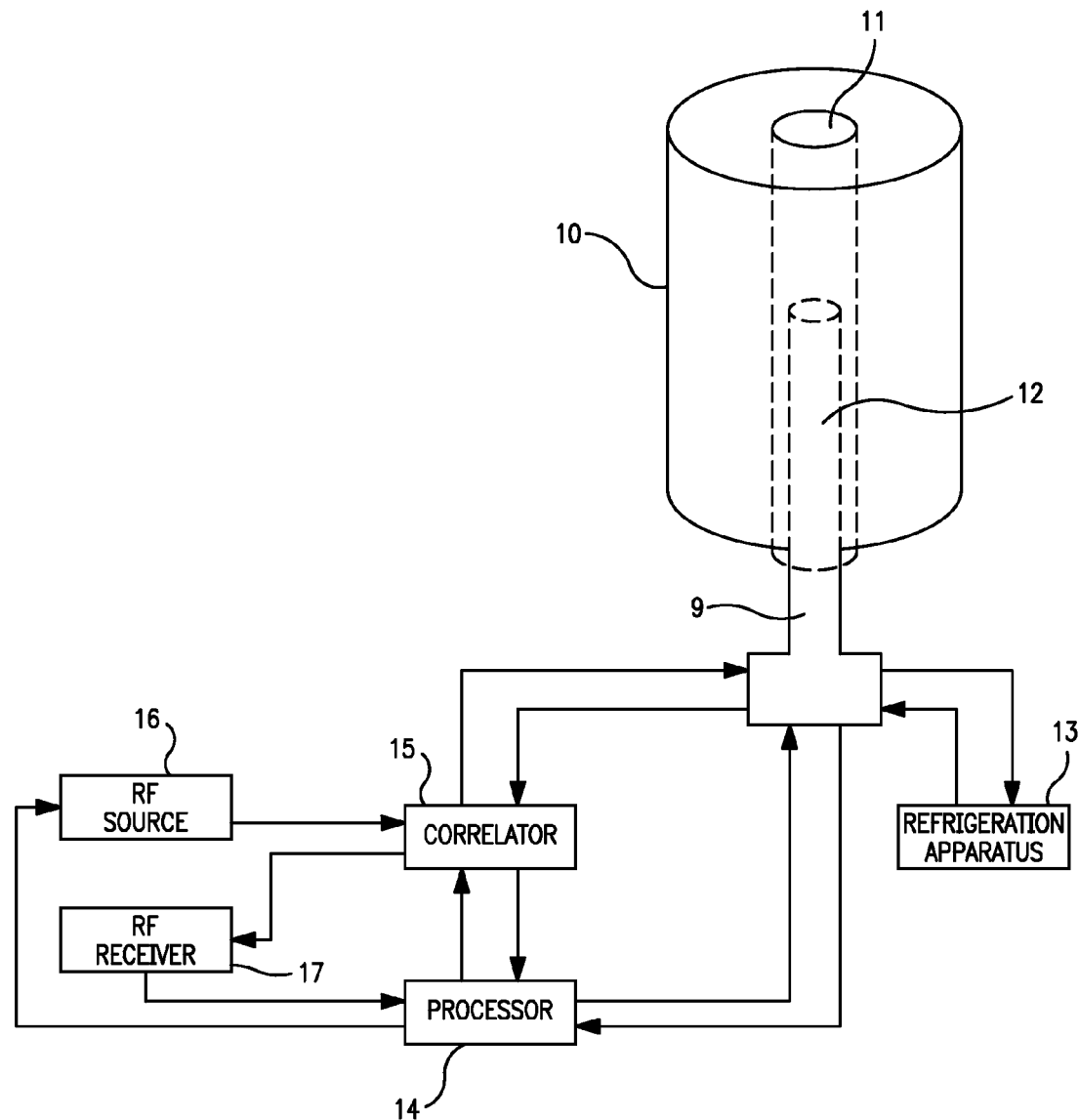
FIG. 1 shows the context of the present work.

FIG. 1 serves to illustrate conceptually the context of this work within an NMR system. An NMR probe assembly 12 is disposed within the bore 11 of a superconducting magnet 10. A sample for analysis is presented in a sample vessel (not shown) inserted in the probe assembly 12. The probe assembly 12 includes RF coils (not shown) inductively coupled to the nuclear spins of the sample (not shown) for excitation/acquisition through at least a first RF excitation channel(s) from an RF source 16 and separately for signal acquisition through receiver channel(s) to receiver 17. Excitation and resonance signal receive functions often share a common probe coil for non-concurrent operation through correlator 15, but multiple coils are frequently employed to serve different functions, or the same coil may be organic to a multiply tuned circuit to serve a variety of functions, such as to furnish spin decoupling, field-frequency lock, and the like. In the present work, either a single coil or multiple coils may utilize the benefit of the modalities of tuning/impedance match mechanical adjustment apparatus disclosed herein. The receive channel ordinarily includes a preamplifier and RF demodulator, phase detector, analog-to-digital conversion (ADC) and various signal processing apparatus, together denoted for simplicity here as receiver 17. A digital processor 14 is used to effect averaging, Fourier transformation, storage, excitation control and general apparatus monitoring functions. More recently, some of these functions are consolidated in a direct digital receiver, but these variations are not critical to the understanding or operation of the present probe circuit adjustment apparatus. An input/output module provides for instruction of the processor 14, provision for display of data and general operator intervention. The probe may be either an ambient temperature probe or a cryogenic probe as suggested by refrigeration apparatus 13 pictured.

The entire probe assembly is axially elongate to place the RF coils of the probe at the position of maximal magnetic homogeneity, the "sensitive region", while distancing other probe components from that location. For example, the present mechanical arrangement, 9, for manipulating adjustable electronic components is organic to the probe assembly is schematically located in the region indicated by 9 in FIG. 1 located at some distance from the center "sensitive region" of the magnet. The mechanical arrangement, 9, communicates via rotatable shafts with circuit components necessarily closer to the RF coil.

Figure 2A:
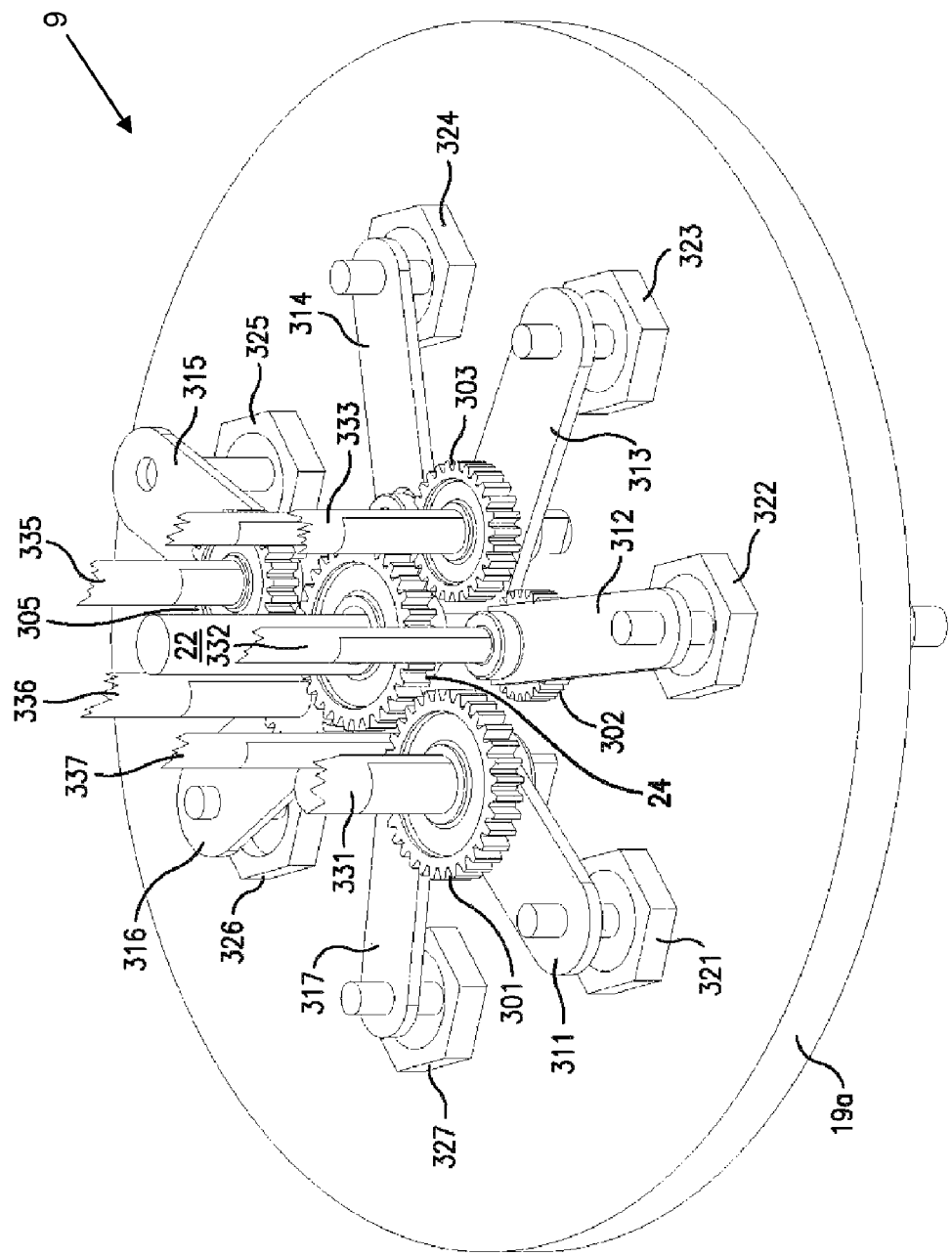
FIG. 2a shows one simplified embodiment of the present work in oblique perspective looking downwardly.
Figure 3A:
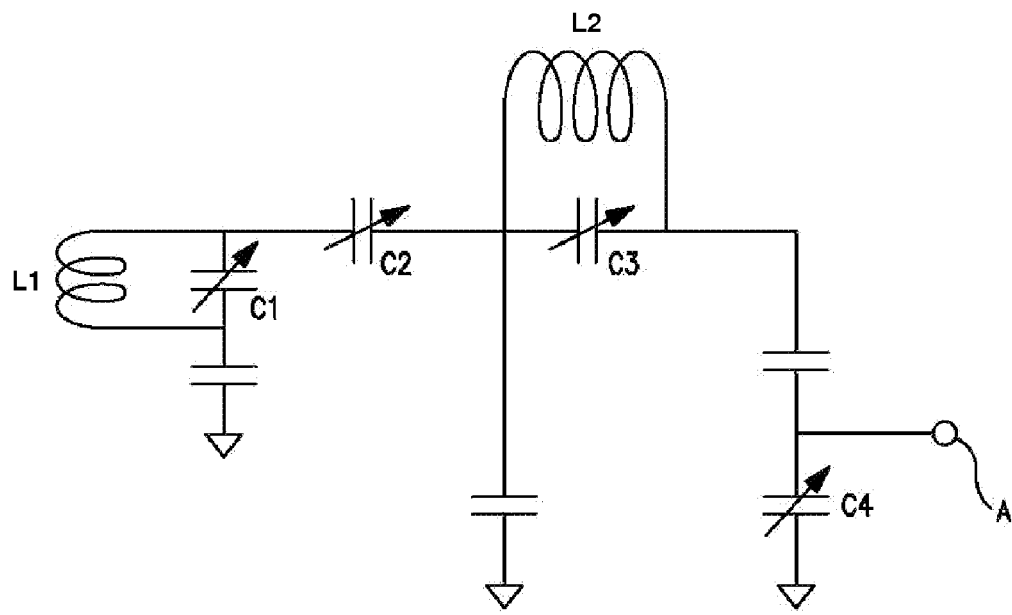
FIG. 3 is an example of a resonant circuit to which the FIG. 1 embodiment is employed.
Figure 3B:
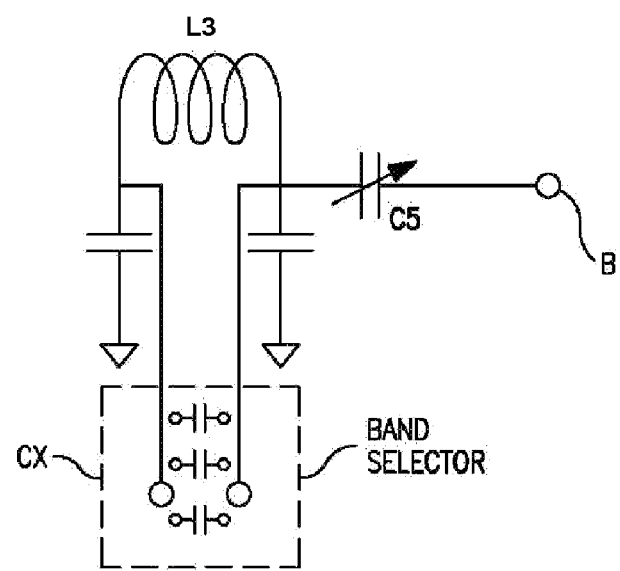

An embodiment of this work is shown in FIGS. 2a, b, c, d and e for the particular case of an NMR probe featuring a double resonant circuit and resonant decoupler using remote/automated circuit adjustments. An exemplary circuit is shown in FIG. 3 with RF coils L1, L2 and L3 and adjustable circuit components corresponding to adjustable capacitors C1, C2, . . . C5 and band selector switch CX. This circuit is shown to establish the nature of the RF adjustments required (for that example circuit) to match the respective transmission lines, (not shown) to resonant circuits denoted from their respective input/outputs A and B and to independently tune those resonant circuits, for a total of six contemplated adjustments including a band selection switch CX to accommodate additional resonant frequencies through insertion of pre-selected reactances. An example of the latter type adjustment is further described in U.S. patent application Ser. No. 10/592,723, assigned to Varian, Inc. The adjustable capacitors C1, C2, . . . C5 may have a range of continuous adjustment (proportional control) to control RF spectral features. Such function is described in U.S. Pat. No. 7,352,185, assigned to Varian, Inc. Mechanical intervention for both proportional and discrete type (switched) adjustments are frequently required. As here described, a prototype of the present work accommodates seven circuit adjustments but it will be understood that the number of adjustments is an arbitrary design specification.

Figure 2B:
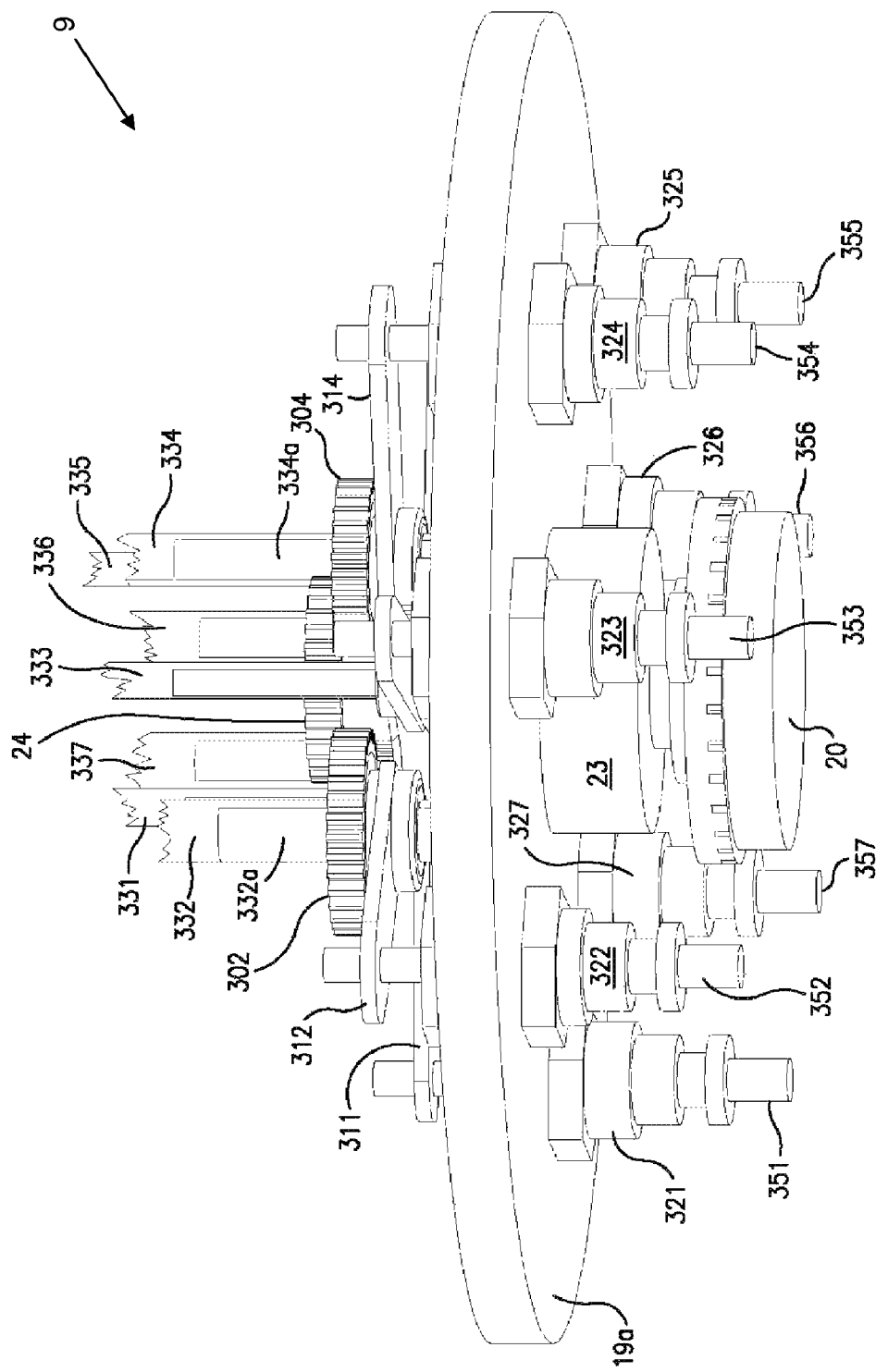
FIG. 2b is the apparatus of FIG. 2a in oblique perspective looking upwardly.
Figure 2C:
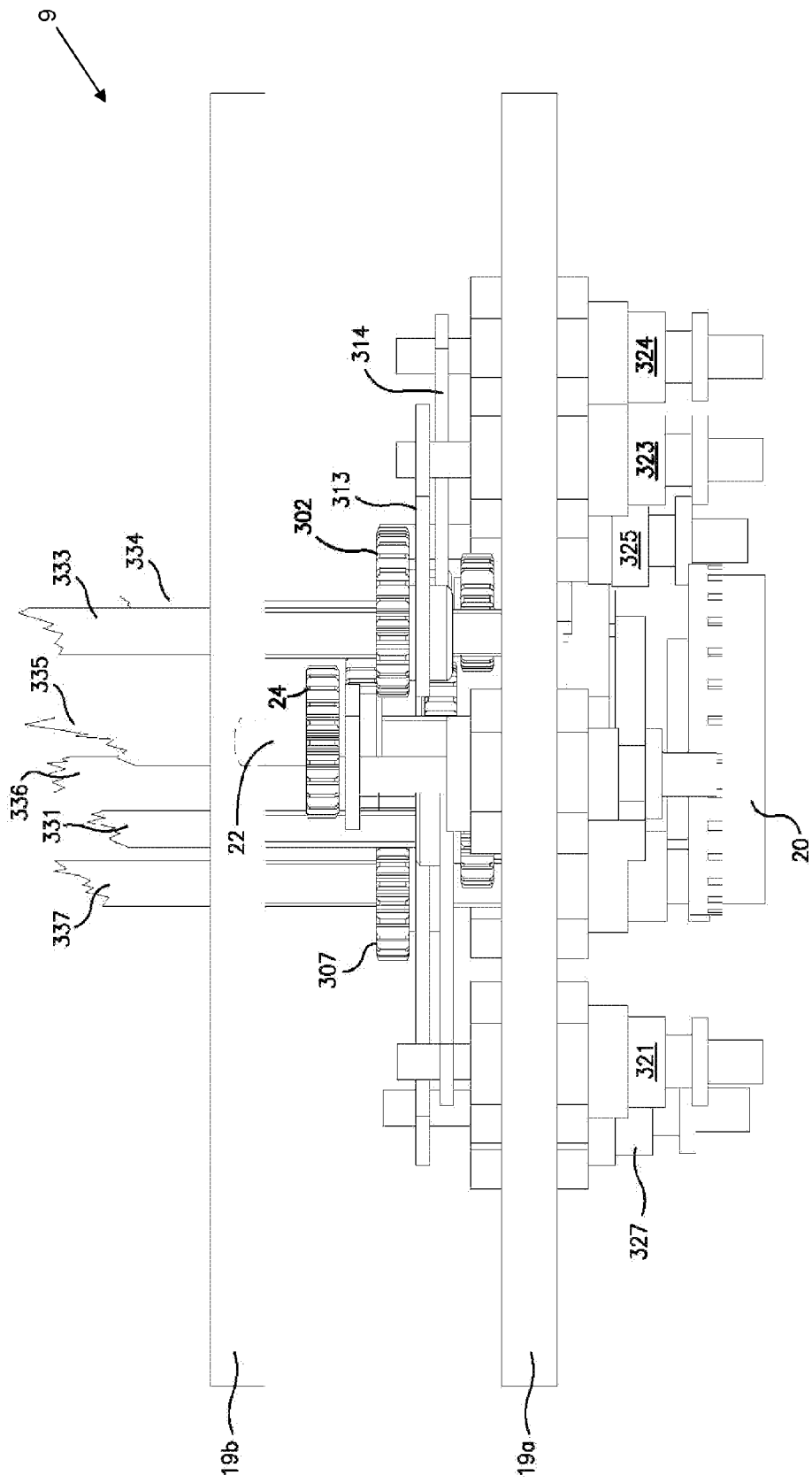
FIG. 2c is the apparatus of FIG. 2a in a profile view.

FIGS. 2a and 2b view the mechanical arrangement 9 of the preferred embodiment of this work in perspective from slightly above and below a direct profile (FIG. 2c). The reader is cautioned that FIG. 2a is shown without top plate 19b, and FIGS. 2a, 2b and 2c are shown without optical gear engagement signal apparatus and with the platens 311, . . . 317 and associated shafts simplified to facilitate the view. FIG. 2c (sparingly labeled for clarity) is a profile view with top plate 19b in place. It should also be understood that in perspective view, each sub-unit (actuator, platen, driven gear, shaft as discussed below) will not be observable, and that sub-units, being virtually identical, some such subunits are not labeled, in order to avoid confusion in the figure.

FIG. 2d, using general two-digit labels, shows the mechanical arrangement of one subunit with the driven shaft 33 extending up to the sensitive region where the probe coils and adjustable circuit components 38 are located. Driven shaft 33 is coupled to the adjustable circuit components 38 to affect tuning and matching of the probe coils. The circuit also shows the construction of a preferred platen 31 and relationship thereof with an optical signal arrangement 34 for confirming engagement of a selected driven gear 30 with the driving gear 24 to derive an engagement confirmation signal on line 26 as further described below.

Figure 2E:
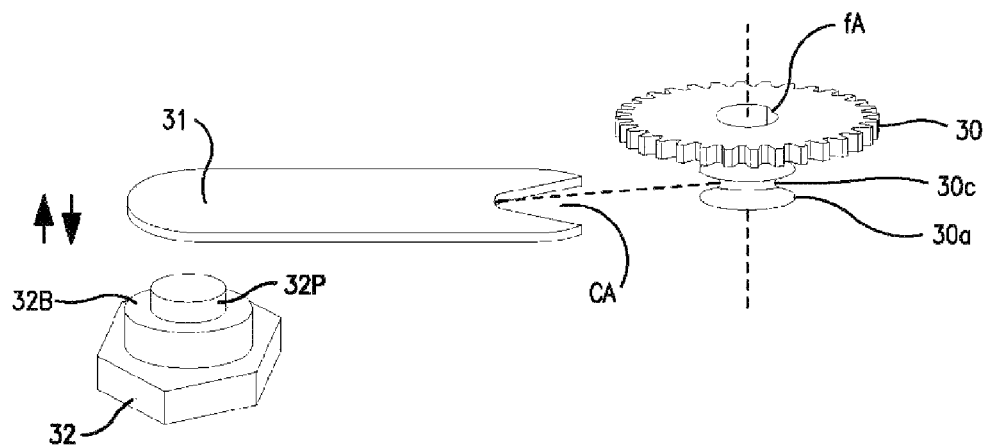
FIG. 2e shows a driven gear and platen structure in perspective.

As shown in FIGS. 2b and 2c, disposed on base plate 19a is bi-directional motor 20, coupled to drive shaft 22 for rotating drive (driving) gear 24 when the motor is activated. The motor 20 is located at some significant distance from the sensitive region of the magnet to prevent undesired effect upon magnetic homogeneity of the sensitive region. However, the strong fringing field of the magnet will be sufficiently intense to compromise operation of a conventional motor. A non-magnetic motor is desired for this function, and a piezo motor type USR30, available from Shinsei Corp., Tokyo, Japan is suitable for this function. Arranged around the periphery of drive gear 24 are a plurality of driven gears 301, 302, 303, . . . 307, each of which is supported on a corresponding platen 311,312,313, . . . 317. These gears are preferably beveled to facilitate ease of engagement. The platen 31 is (for the general sub-unit, 2 digit labels are employed) as shown in FIGS. 2d and 2e comprises a forked aperture CA engaging a radial groove 30c in the gear collar 30a of driven gear 30. The driven gear assembly 30, 30a has rotational freedom in the tines of the forked aperture CA. This arrangement permits the platen 31 to urge the driven gear 30 in either axial direction upon actuation of the actuator 32 and to return the driven gear 30 in the reverse axial direction upon de-actuation. Upon actuation of actuator 32, driven gear 30 is meshed with drive gear 24 enabling bidirectional motor 20 to rotate driven shaft to thereby adjust circuit component 38. In a quiescent state, all driven gears are disengaged from the driving (or, drive) gear 24 and with corresponding platen are axially displaced from the plane of the driving gear 24. The platen 31 is mechanically coupled to a corresponding linear actuator 32. (For convenience, any one of the driven gear/platen/actuator/driven shaft/adjustable circuit component combinations may be designated respectively as 30/31/32/33/38 for ease of description.) The linear actuator 32 comprises a piston 32P, extensible from a body 32B in a well known general structure. It is understood that the several actuators, labeled 32 for generality, are regarded as bearing designations 321, 322, . . . 327 for the 7 shaft apparatus of FIGS. 2a-2c.

Driven gears 301, 302, etc., are supported on either side of the corresponding platen, as shown in FIG. 2a where adjacent driven gears 301 and 302 are supported on opposite sides of their respective platens 311 and 312. Engagement of the driven gear with the driving gear may be effected by axial motion in either axial direction. Accordingly, the quiescent position of the driven gear may be on either (axial) side of the driving gear. The exact arrangement, in this regard, is a design choice depending upon the diameters of the several driven gears and the available space.

Figure 4:
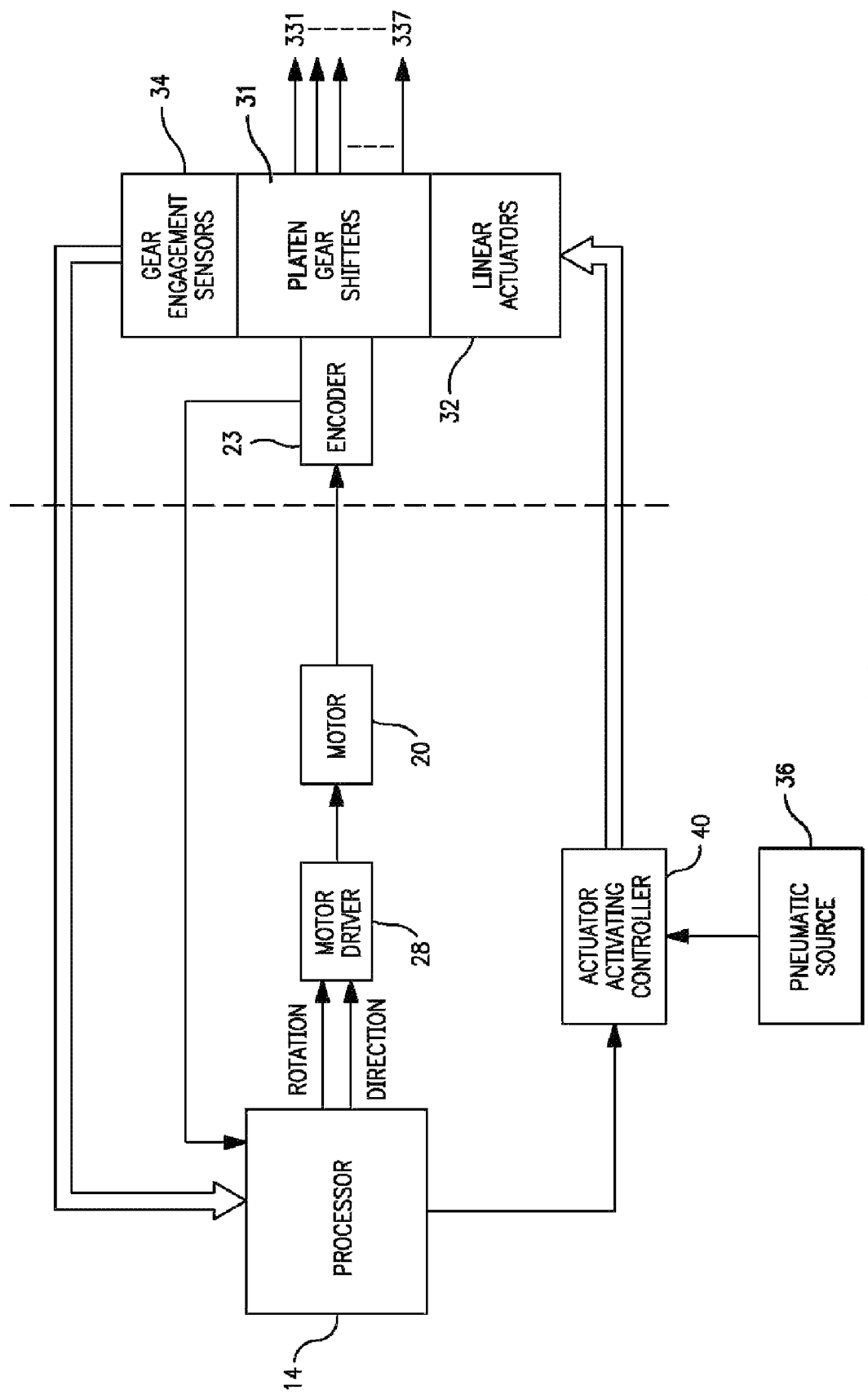
FIG. 4 illustrates the block diagram for the activation power for the embodiment of FIGS. 2a, 2b, 2c and 2d.

Positive pressure pneumatic actuators are preferred for this application, but other types of actuators can be employed. Gas inlets 351, . . . 357 for the respective actuators are shown in FIG. 2b (where visible). It will be understood that pneumatic tubing is directed from gas inlets 351, . . . 357 to a pneumatic source 36 and controller 40 as shown in FIG. 4 with timing diagram shown in FIG. 5. The controller 40 comprises remotely actuated gas pressure valves not shown under control of processor 14 (FIG. 1) in straightforward fashion. One suitable linear actuator is type E4, available from US Digital Corp., Vancouver, Wash. The linear actuator 32 is disposed to produce axial displacement of the platen 31 along the direction of driven shaft axis 33, thereby bringing the corresponding driven gear 30 into engagement with the drive gear 24. A shaft encoder 23 is disposed to sense the number of driving shaft rotations from an arbitrary base position and the angular position of the driving shaft 22. This data is available to the processor 14 to facilitate return of the selected driven shaft 33 to a known position or neighborhood thereof (given associated hysteresis). Such shaft encoders are well known.

Optical sensor(s) 34 (FIG. 2d) is positioned to confirm engagement of the driven gear 30 with the driving gear 24 when this condition occurs. An opaque shutter 34c is disposed to occupy the space between a light source 34a and optical detector 34b when the actuator 32 has displaced the platen 31 to reach the engagement position. This signal is logically required to allow power to the motor.

Each driven gear 301,302, . . . 307 is rotationally supported (azimuthally locked) on a corresponding driven shaft 331, 332,333, . . . 337 while free to translate axially over at least a portion of that driven shaft. This is most simply achieved, as in FIG. 2b by providing a flat (such as 332a) on the driven shaft 332 and in FIG. 2e, an aperture fA congruent to the flattened shaft region of the driven shaft. The flattened region of the shaft is delimited at one end to limit the upper axial travel of the driven gear. The platen 31 serves to provide a stop for the lower bound for axial travel. Although a wide variety of non-circular cross sections would be acceptable for the relevant portion of shaft 33 and conforming aperture fA, a simple flattened region of selected included angle is preferred for ease of manufacture. It is to be understood that the several driven shafts and the driving shaft are maintained in respective alignments by top plate 19b (FIG. 2c) comprising circular apertures for the free rotation of the respective shafts 331, 332, . . . 337. In like manner, each platen, exemplified by 31 comprises circular apertures CA for free rotation therethrough of the shaft 33.

Figure 5:
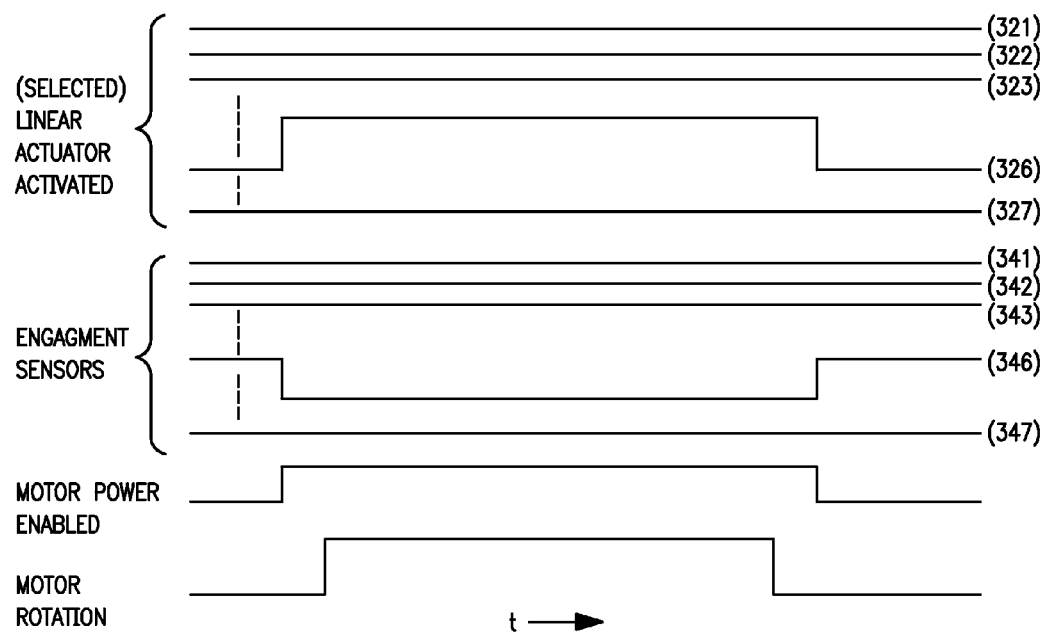
FIG. 5 is an example of the logic signals employed for enablement/lockout of actuators.

Shaft rotation should not be understood as providing an exclusively rotational adjustment for the adjustable circuit component (e.g., capacitor). Translational displacement is easily obtained from a rotating shaft engaging a captive nut, or lead screw associated with a translating portion of the adjustable component. Such arrangements are well known, as is the manner of adjustment of the adjustable circuit component (capacitor plate) and need not be further discussed. Driven shafts 331, 332, . . . 337 are variously shown in abbreviated length in FIGS. 2a, 2b and 2c. These shafts may be of the order of a half meter in length in typical use. Although not explicitly shown in FIGS. 2a to 2c, they are coupled to corresponding adjustable circuit components 381, 382, . . . 187. The driven shafts 331, 332, . . . 337 extend from the bottom of magnet 10 (FIG. 1) through the probe assembly and coupled to the adjustable circuit components located near the sensitive region of the magnet. FIG. 3 is one example with adjustable circuit components 381-386 comprising adjustable capacitors C1-C5 and band selector switch CX. The drive shaft 22 extends no further axially than necessary for mechanical alignment and is shown terminating in a blind bearing cavity of top plate 19a. Closed loop tuning is achieved with a combination of the selection of the driven shaft of FIGS. 2a, 2b, 2c, 2d and 2e, together with a controller as provided in FIG. 4 operating with standard control logic producing logic signals as illustrated in FIG. 5 (where components providing or receiving the signal are indicated on the right of the waveform). A particular tuning operation is selected by processor 14, either from programmatic sequence or by direct operator instruction. The processor 14 effectuates an interlock arrangement through straightforward logic operations whereby only a single selected tuning operation is enabled concurrently. Processor 14 checks the status of all optical source/detector combinations to assure no fault in any one of them. Particular operations for the processor 14 are outside the scope of this work and are well understood and easily constructed by one of skill in the art. It is sufficient to recognize how the functional results of these common processor operations combine with the operation of the present work to provide for efficient multiplexing of a plurality of circuit adjustments from a single motor. Processor 14 then selects the corresponding pneumatic control valve and a selected actuator 32 of the set of actuators 321,322, . . . 327 is activated. As described above the associated platen 31 translates the selected driven gear 30 axially to engage the driving gear 24 and such engagement is confirmed by optical sensor signal on signal line 26 which signal informs processor 14 and motor driver 28 is then enabled. Motor motion is initiated by processor 14 and the selected driven shaft 33 rotates in a selected sense of rotation to advance or retard the value of the corresponding selected circuit component in accord with an auto-tune/match algorithm. The operation of a suitable auto-adjust algorithm is outside the scope of the present work and such algorithms are well known for optimizing circuit performance in respect of received RF signal, or standing wave ratio in accord with criteria that depends upon the function to be optimized (tuning or matching). The present work provides an agency for circuit adjustment that can be employed in a wide variety of automated circuit adjustment procedures.

As suggested above, in addition to enabling an appropriate interlock among the selectable operations, the processor 14 detects fault arising from failure of any light source/detector by examining the status of each of these combinations of gear engagement sensors 34 prior to activating the selected actuator. Other fault detection operations may be effected: for example, positive confirmation of driven shaft rotation can be monitored as discussed below. One anticipated fault condition arises from failure of engagement of the driving gear with driven gears. The shaft encoder 23 provides azimuthal coordinates for the drive gear 24 whereby it may be accurately positioned for engagement with the selected driven gear 30 to within an angular increment Δθ representing the angular tooth spacing of drive gear 24. A failure to engage is easily remedied by rotating the drive gear 24 by a correcting angular increment, such as 0.5 Δθ, and re-engaging.

Figure 6:
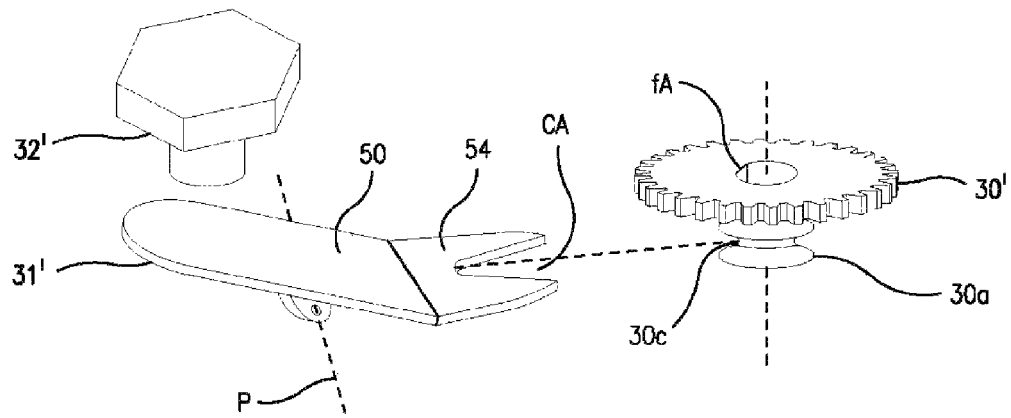
FIG. 6 illustrates a levered embodiment for short stroke actuators.

Although pneumatic actuators are preferred, an alternate embodiment is easily realized using piezo actuators, or other equivalent linear actuators. In some instances the maximum stroke realizable by the alternate linear actuator may be shorter than desired for other design purposes. Additional intermediate linkage, as shown in FIG. 6 provides the desired additional linear displacement. Alternate linear actuator 32' (of presumable short stroke) is disposed to produce displacement anti-parallel to the desired axial displacement of the platen 31'. Platen 31' is urged axially by lever portion 50 rotationally about a pivot P disposed intermediate actuator piston 32' and platen 31'. A hinged portion 54 of platen 31' provides angular compensation for the slight angular displacement of the lever 50 about its pivot P, thereby allowing the gear collar to slide smoothly along the driven shaft 33.

It is preferable to employ a linear actuator that maintains a constant positive displacement throughout the duration of the actuation. Commercially available linear actuators operate against an internal spring which rapidly returns the actuator piston to its relaxed state. Upon de-activation of the linear actuator, the piston or equivalent portion thereof returns to its quiescent condition returning the platen 311, . . . 317 to a corresponding (quiescent) axial position.

In another embodiment for confirming proper operation, e.g., fault detection, FIG. 7 shows an arrangement where a reflective patch R is affixed to a limited arc of each driven shaft 33 to complete a light path from a source 35' to detector 35". Fault free engagement of driven gear 30 with driving gear 24 yields a pulse train P on signal line 26' that is coupled to optical detector 35". The pulse train P is precisely related to the rotation rate of the motor 20 by the gear ratio of driven to driving gears. Accordingly, the particular shaft is identifiable as rotating at the specified rate.

In a variation of embodiments discussed, there is an advantage in providing extensions of the driven shafts (here 331 through 337, or the general driven shaft 33) through and beyond (not shown) the bottom plate 19*a*. This permits manual manipulation of a disengaged shaft. Such manual manipulation is often essential during maintenance operations, or if it is desired to manually tune, match or otherwise adjust the circuit, or to combine manual operation of some selected circuit parameter with processor controlled adjustment of other circuit parameter(s). In this arrangement it is noted that the shaft encoding arrangement of FIG. 7 informs the processor 14 of the manual shaft rotation independent of shaft encoding of the driving shaft. This provides for a particularly useful way to initialize values of circuit parameters.

Figure 8:
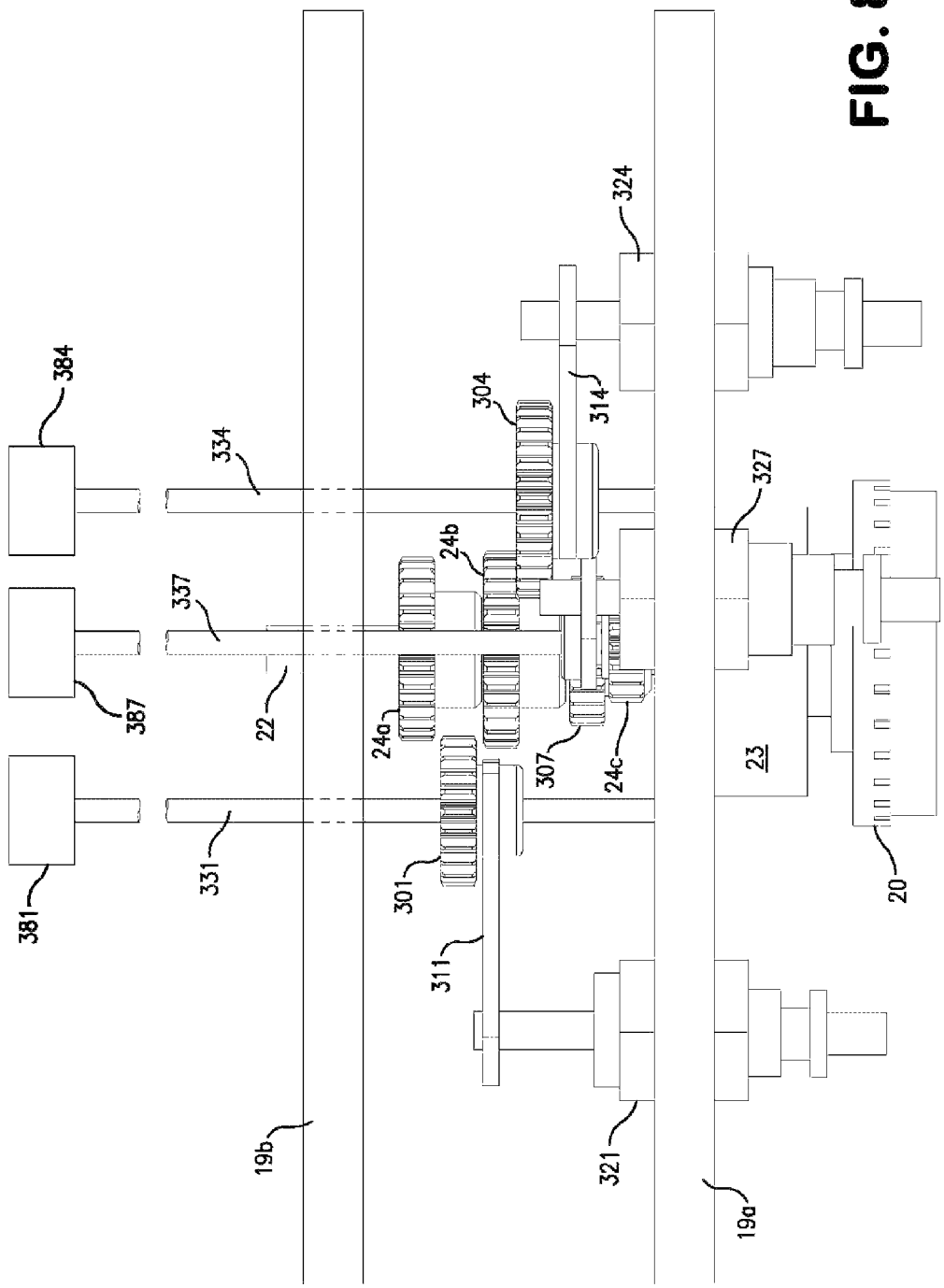
FIG. 8 represents salient aspects of another embodiment comprising multiple driving gears.

Yet another embodiment utilizes multiple driving gears 24*a*, 24*b*, 24*c* on the same drive shaft 22 of the motor 20 is illustrated in FIG. 8. These multiple driving gears, spaced apart on shaft 22, provide for different rotational rates of selected groups of shafts. In an arrangement for adjusting as many as 7 circuit parameters, the illustrative embodiment groups 6 gears (shafts) in two groups of three and a third group comprising a single driven shaft. This is illustrated in FIG. 8 where for simplicity, only three individual gear/platen/driven shaft/adjustable circuit components units are shown. In the example of FIG. 8, three driven gears a first group, represented by gear 301 is distributed about the circumference of drive gear 24*a* and spaced axially therefrom by the stroke length of the respective actuator. A second group of three driven gears (represented in the figure by one of them, e.g., 304), are arranged circumferentially about driving gear 24*b* and axially spaced therefrom. Driven gear 307 (comprising a third group) is disposed to engage driving gear 24*c* upon excitation of the corresponding actuator. Different driving gears and corresponding driven gears may be designed for achieving desired gear ratios through choice of gear diameter, tooth specifications and the like, and in this manner, a desired rotation rate is available for different functionalities as represented by the respective groups. In respect of the circuit served by the shaft selector of this work, different circuit adjustments of differing sensitivity or function may be more efficiently adjusted. For example, a switch-like component such as CX of FIG. 3 does not require the same degree of mechanical resolution as a tuning or matching adjustable capacitor. For purely mechanical convenience, the variety of dimensional specifications provides design freedom for the placement of driven shafts outside the constraints imposed by a fixed sum of drive gear and driven gear radii.

Although this invention has been described with reference to particular embodiments and examples for obtaining a plurality of electronic adjustments in an NMR probe using a single motor, other modifications and variations will occur to those skilled in the art in view of the above teachings. For example, negative pressure linear actuators are not precluded for implementing this work. It should be understood that, within the scope of the appended claims, this invention may be practiced otherwise than as specifically described.

APPENDIX

Number Part
9 mechanical arrangement (FIG. 1)
10 magnet
11 bore
12 probe assembly
13 refrigeration apparatus
14 processor
15 correlater
16 RF source
17 Receiver
19*a* base plate (FIG. 2*a*, 2*b*, 2*c*, 8)
19*b* top plate (FIG. 2*c*, 8)
20 bidirectional motor (FIG. 2*b*, 2*c*, d, 7, 8)
22 drive shaft (2*a*, 2*c*, 2*d*, 7, 8)
23 drive shaft encoder (FIG. 2*b*, 2*d*, 7,8)
24*a*,24*b*,24*c* drive or driving gear (2*a*, 2*b*, 2*c*, 2*d*, 7, 8)
26, 26' signal line (FIG. 2*d*, 7)
28 motor driver (FIG. 4)
30, 30', 301-307 driven gear
30*a* gear collar
30*c* radial groove
31, 31', 311-317 platen
32, 321-327 linear actuator or actuator
32B actuator body
32P actuator piston
32' alternate actuator
33, 331-337 driven shaft
33*a*, 331*a*-337*a* flat region of shaft (FIG. 2*b*, 2*d*, 7)
34, 341-347 gear engagement sensor (FIGS. 2*d* & 4)
34*a* light source
34*b* optical detector
34*c* optical shutter
35' light source
35" light detector
36 pneumatic source (FIG. 4)
38, 381-387 adjustable circuit component. (FIG. 2*d*, 7, 8)
40 controller (FIG. 4)
50 lever
54 hinged portion of platen 31
351-357 gas inlets

What is claimed is:

1. An NMR apparatus comprising an NMR probe with an RF coil for stimulating a nuclear magnetic resonance in a sample and detecting response, a first plurality of adjustable circuit components tuning and matching the RF coil, each said adjustable circuit component mechanically coupled to a corresponding driven shaft for enabling adjustment of the corresponding adjustable circuit component, a first plurality of driven gears, at least one driven gear of said plurality connected to the corresponding driven shaft of each adjustable component, said driven gear being capable of axial displacement along the direction of said driven shaft and azimuthally fixed to rotation of said driven shaft;

a motor for rotating at least one driving gear capable of engaging with any one driven gear of said plurality; and a first plurality of linear actuators, each linear actuator mechanically coupled to a corresponding platen, said platen disposed to urge, upon actuation of said linear actuator, a corresponding driven gear along said corresponding driven shaft to a state of engagement with said driving gear, whereby said adjustment of the corresponding adjustable circuit component is made.

2. The NMR apparatus of claim 1, wherein said platen comprises a planar body having a forked aperture, and said corresponding driven gear comprises an axially extending collar comprising a radial groove to engage said forked aperture whereby said platen is capable of urging said corresponding driven gear in either direction along said corresponding driven shaft.

3. The NMR apparatus of claim 1, wherein axial displacement of said corresponding driven gear along said corresponding driven shaft and azimuthal fixing of said corresponding driven gear to said corresponding driven shaft comprises a flattening of a lateral portion of said corresponding driven shaft and an aperture in said corresponding driven gear wherein said aperture is congruent with a cross section of said lateral portion.

4. The NMR apparatus of claim 1, further comprising a controller capable of activating a selected one of said linear actuators and for enabling an interlock arrangement to assure only a single actuator is capable of linear displacement concurrently.

5. The NMR apparatus of claim 1, further comprising a shaft encoder cooperating with said driving gear to determine the angular increment of rotation of said driving gear.

6. The NMR apparatus of claim 2, wherein said linear actuator is a pneumatic device.

7. The NMR apparatus of claim 2, wherein said linear actuator is a piezo device.

8. A method of adjusting a selected adjustable circuit component by engaging a corresponding driven gear with a driving gear in an NMR apparatus with NMR probe having an RF coil for stimulating a nuclear magnetic resonance in a sample and detecting response, a first plurality of adjustable circuit components tuning and matching the RF coil, each said adjustable circuit component mechanically coupled to a corresponding driven shaft for enabling adjustment of the corresponding adjustable circuit component, said method comprising the steps of:
 (a) energizing a corresponding linear actuator to bear against a platen;
 (b) urging said platen against said driven gear to displace said corresponding driven gear axially in a first direction and to engage said driving gear while azimuthally constraining said corresponding driven gear to a corresponding driven shaft;
 (c) rotating said driving gear in a selected sense of rotation, whereby said corresponding driven shaft is rotated, and
 (d) providing mechanical linkage from said respective driven shaft to adjust said selected adjustable circuit component, whereby adjustment of the selected circuit component is made in said NMR apparatus.

9. The method of claim 8, wherein said step of rotating comprises recording revolutions and fractions of revolutions and rotational sense thereof of said driving gear.

10. The method of claim 8, wherein said step of engaging comprises generating a signal indicative of successful engagement of said corresponding driven gear with said driving gear.

11. The method of claim 8, further comprising the steps of:
 e) de-energizing said selected linear actuator;
 f) urging said platen axially opposite to said first direction and dis-engaging said corresponding driven gear from said driving gear.

\* \* \* \* \*